United States Patent [19]

Kim

[11] Patent Number: 5,366,930

[45] Date of Patent: Nov. 22, 1994

[54] METHOD FOR MAKING HIGHLY INTEGRATED SEMICONDUCTOR CONNECTING DEVICE USING A CONDUCTIVE PLUG

[75] Inventor: Jae K. Kim, Bubaleub, Rep. of Korea

[73] Assignee: Hyundai Electronics Industries Co., Ltd., Rep. of Korea

[21] Appl. No.: 156,364

[22] Filed: Nov. 23, 1993

[30] Foreign Application Priority Data

Nov. 24, 1992 [KR] Rep. of Korea ............... 1992/22251

[51] Int. Cl.$^5$ ........................................ H01L 21/441
[52] U.S. Cl. ..................................... 437/195; 437/60; 148/DIG. 20
[58] Field of Search ................ 437/60, 190, 195, 978; 148/DIG. 20, DIG. 43

[56] References Cited

U.S. PATENT DOCUMENTS

| | | | |
|---|---|---|---|
| 4,906,593 | 3/1990 | Shioya et al. | 148/DIG. 20 |
| 5,081,060 | 1/1992 | Kim | 478/978 |
| 5,114,879 | 5/1992 | Madan | 437/195 |
| 5,219,792 | 6/1993 | Kim et al. | 437/195 |
| 5,223,448 | 6/1993 | Su | 437/60 |

*Primary Examiner*—Brian E. Hearn
*Assistant Examiner*—Chandra Chaudhari
*Attorney, Agent, or Firm*—Merchant, Gould, Smith, Edell, Welter & Schmidt

[57] ABSTRACT

A semiconductor connecting device and a method for making the same are disclosed. The semiconductor connecting device is comprised of a device separation insulating film, a source region and a drain region formed at predetermined portions of a semiconductor substrate; an interlayer insulating film formed on the device separation insulating film and on the drain region, having a contact hole through which a portion of the device separation film are exposed along with a portion of the drain region; a conductive plug formed on the exposed portion of the drain region and on the exposed portion of the drain region within the contact hole, the drain region-sided conductive plug being thinner than the device separation insulating film-sided one; and bit lines formed on the conductive material plug and the interlayer insulating film, coming into contact with them, respectively. In accordance with the present invention, the bit line connected with the drain region scarcely overlaps the source region where the charge storage electrode is formed, bring about the reduction of area as minimally as possible along with a highly integrated semiconductor device.

8 Claims, 10 Drawing Sheets

METHOD FOR MAKING HIGHLY INTEGRATED SEMICONDUCTOR CONNECTING DEVICE USING A CONDUCTIVE PLUG

BACKGROUND OF THE INVENTION

1. Field of the invention

The present invention relates to a highly integrated semiconductor connecting device and a method for making the same, and more particularly to improvements in integration degree of a semiconductor device along with a semiconductor connecting device and a method for making the same.

2. Description of the Prior Art

For convenience's sake, description which will be given next for a conventional connecting device and method is confined within a connecting device comprising a bit line to be connected with a drain region in the structure of a dynamic random access memory (DRAM) cell, in which a bit line connected with a drain region is formed in advance of a capacitor connected with a source region.

Generally, for the sake of forming a gate region and source/drain electrodes in one active region and connecting a bit line with the drain region in advance of forming a charge storage electrode contact in the source region, the bit line is positioned above a device separation insulating film which is between the source regions in such a way not to be placed above the source region or to minimally overlap with the source electrode. However, in case that a bit line contact and a charge storage electrode contact, when forming a bit line to be connected with the drain region, are linearly positioned on the same line with the bit line, since the bit line is sufficiently connected with the bit line contact formed in the drain region and the neighboring bit lines are to be spaced apart, the bit line neighboring the bit line connected with the drain region is positioned above the neighboring source region, at last.

A conventional DRAM cell is to be described with reference to a few figures for the better understanding of the prior art.

Referring initially to FIG. 1, there is a schematic plan view showing only important mask layers for fabricating a DRAM cell, in which a bit line connected with a drain region is formed in advance of a capacitor connected with a source region according to a conventional method. While reference numeral 1 designates an active region mask in the figure, reference numerals 2, 3 and 4 designate a bit line contact mask, a bit line mask and a charge storage electrode contact mask, respectively. As illustrated in this figure, the drain region which is formed at a lower part than the source in an active region 1a is connected with the bit line 3, so that the bit line 3 is scarcely positioned above the source region in which the charge storage electrode contact 4. However, as the drain region is extended below the source region in which the charge storage electrode 4 is formed, two active regions 1b and 1c positioned below the drain region have to be at some distance each other in order that the drain region Keep apart from the active regions positioned below, causing the area of cell to increase.

For more detailed description, FIGS. 2A to 2C are referred to, which are schematic cross-sectional views illustrating the steps for forming the bit line in a DRAM cell according to a conventional method, respectively, taken generally through section line A—A ' of FIG. 1.

First, as shown in FIG. 2A, over a predetermined portion of a semiconductor substrate 5, an active region and a device separation insulating film 6 are formed, followed by the formation of a gate region (not shown), a source region (not shown) and a drain region 7 over the active region. An interlayer insulating film 8 is formed entirely on the resulting structure. At this time, the active region where the drain region is formed is formed in such a way to be extended below another active region where the source region is formed (refer to FIG. 1).

Subsequently, a bit line contact hole is formed on a predetermined portion of the drain region 7 and then, a conductive material for bit line 14 is entirely deposited over the resulting structure, as shown in FIG. 2B. At this time, the bit line contact is to be positioned below the charge storage electrode contact formed in the source region at later process, as shown in FIG. 1.

Finally, using the bit line mask 3, the conductive material for bit line 14 is etched so partly as to form a bit line 16, as shown in FIG. 2C. The bit line is connected with the drain region 7 which is formed below the active region where the source region is formed, so that the bit line 16 is scarcely positioned above the source where the charge storage electrode is formed.

However, By the above conventional method, the drain region is formed in such a way to keep apart from the two neighboring active regions linearly positioned below the drain region, which are forced to be at some distance each other, causing the area of cell to increase.

SUMMARY OF THE INVENTION

Therefore, an object of the present invention is to solve the aforementioned problems encountered in the prior arts and to provide a highly integrated semiconductor connecting device and a method for making the same, capable of securing the connection between a bit line and a drain region and minimizing cell area.

According to an aspect of the present invention, this object can be accomplished by the provision of a semiconductor connecting device comprising of: a device separation insulating film, a source region and a drain region formed at predetermined portions of a semiconductor substrate; an interlayer insulating film formed on said device separation insulating film and on said drain region, having a contact hole through which a portion of said device separation film are exposed along with a portion of said drain region; a conductive plug formed on the exposed portion of said drain region and on the exposed portion of said drain region within the contact hole, the drain region-sided conductive plug being thinner than the device separation insulating film-sided one; and bit lines formed on said conductive material plug and said interlayer insulating film, coming into contact with them, respectively.

In accordance with another aspect of the present invention, there is provided a highly integrated semiconductor connecting device, comprising of: a device separation insulating film, a source region and a drain region formed at predetermined portions of a semiconductor substrate; a n interlayer insulating film formed on said device separation insulating film and on said drain region, having a contact hole through which a portion of said device separation film are exposed along with a portion of said drain region;and a bit line formed on the exposed portion of said drain region and on the exposed portion of said drain region within the contact hole, the drain region-sided bit line being thinner than the device separation insulating film-sided one.

In accordance with a further aspect of the present invention, there is a highly integrated semiconductor connecting device, comprising of: a device separation insulating film, a source region and a drain region formed at predetermined portions of a semiconductor substrate; a second interlayer insulating film covering an etching barrier material atop a first interlayer material formed on said device separation insulating film and on said drain region, having a contact hole through which a portion of said device separation film are exposed along with a portion of said drain region; a pair of spacer insulating films formed at both side walls of said contact hole; and a bit line formed on the exposed portion of said drain region and on the exposed portion of said drain region within the contact hole, the drain region-sided bit line being thinner than the device separation insulating film-sided one.

The highly integrated semiconductor connecting device according to an embodiment of the present invention is made by a method comprising the steps of: coating an interlayer insulating film entirely over a semiconductor substrate sectioned into an active region and a device separation region by the formation of a device separation insulating film, a gate electrode, a source region and a drain region being formed in said active region; forming a contact hole to expose a portion of said drain region and a portion of said device separation insulating film; depositing a conductive material for forming a plug entirely over the resulting structure; applying an etch back process to said conductive material for forming a plug to form a first conductive material plug; depositing a conductive material for bit line, entirely over the resulting structure; etching completely said conductive material for bit line positioned on said first conductive material plug formed on said drain region within said contact hole to form a bit line; and etching not completely but partially said first conductive material plug formed on said drain region within said contact hole to form a second conductive material plug.

The highly integrated semiconductor connecting device according to another embodiment of the present invention is made by a method comprising the steps of: coating an interlayer insulating film entirely over a semiconductor substrate sectioned into an active region and a device separation region by the formation of a device separation insulating film, a gate electrode, a source region and a drain region being formed in said active region; forming a contact hole to expose a portion of said drain region and a portion of said device separation insulating film; depositing a conductive material for forming a plug entirely over the resulting structure; and etching not completely but partially said conductive material for bit line formed on said drain region within said contact hole to form a bit line.

The highly integrated semiconductor connecting device according to a further embodiment of the present invention is made by a method comprising the steps of: forming a gate electrode, a source region and a drain region at an active region which is sectioned by the formation of device separation insulating film in a semiconductor substrate; coating an interlayer insulating film intercalated with an etching barrier material therebetween on the resulting structure, the interlayer insulating film being sectioned into a first interlayer film and a second interlayer film; applying an etch process to said interlayer insulating film to form a contact hole exposing a portion of said drain region and a portion of said device separation insulating film therethrough; forming a pair of spacers at the both side walls of said contact hole; depositing a conductive material entirely over the resulting structure; and etching not completely but partially said conductive material for bit line formed on said drain region within said contact hole to form a bit line.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth in detail a certain illustrative embodiment of the invention, this being indicative, however, of but one of the various ways in which the principles of the invention may be employed.

DETAILED DESCRIPTION OF THE PREFERRED EMBODIMENTS

Figure 1:
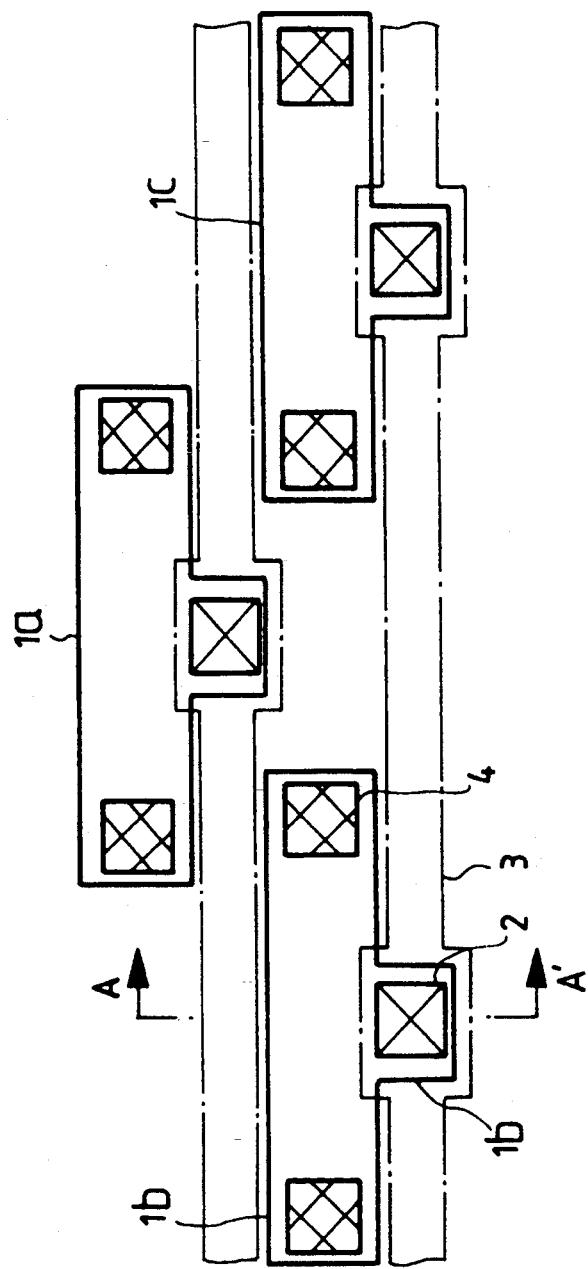
FIG. 1 is a schematic, plan view showing only important mask layer needed to illustrate a conventional method for fabricating a DRAM cell, in which a bit line connected with a drain region is formed in advance of a capacitor connected with a source region.
Figure 2A:
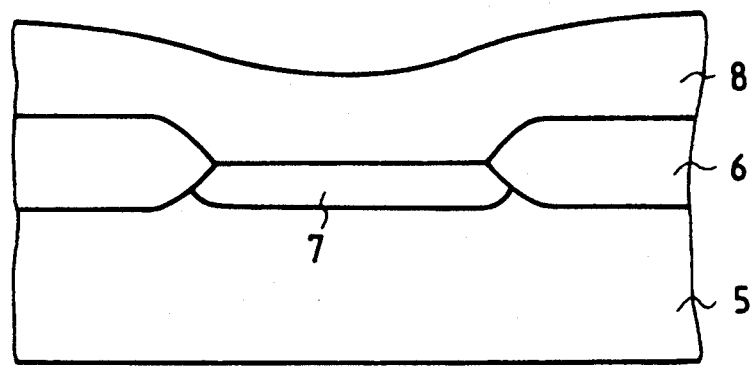
FIGS. 2A through 2C are schematic, cross sectional views illustrating the steps for making a bit line according to the conventional method, respectively, taken generally through section line a—a' of FIG. 1.
Figure 2B:
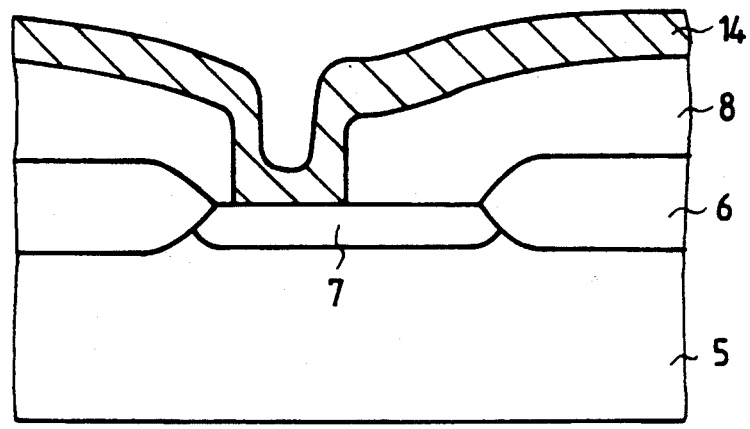
Figure 2C:
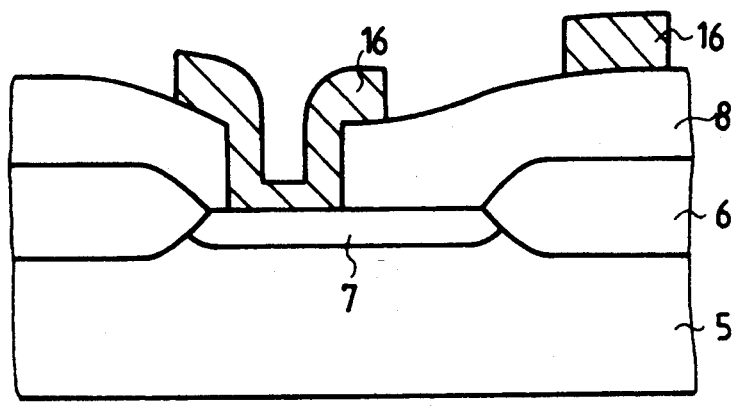

Hereinafter, the preferred embodiments will be described in detail with reference to some drawings, wherein like reference numeral s designate like parts.

Figure 3:
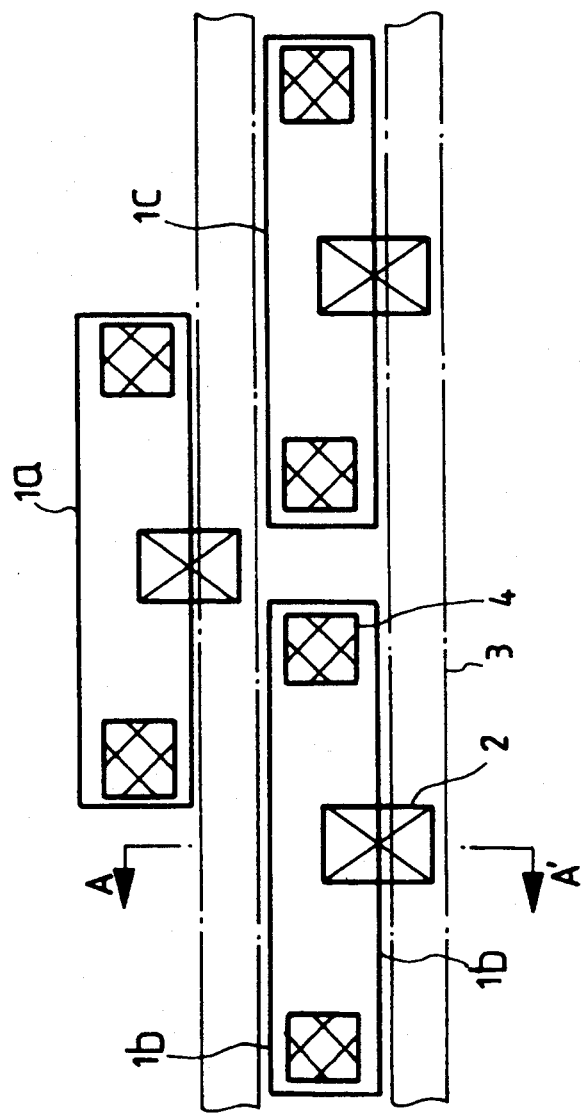
FIG. 3; is a schematic, plan view showing only important mask layer needed to illustrate the inventive method for fabricating a DRAM cell, in which a bit line connected with a drain region is formed in advance of a capacitor connected with a source region.

Referring initially to FIG. 3, there is a schematic plan view showing only important mask layers for fabricating a DRAM cell, in which a bit line connected with a drain region is formed in advance of a capacitor connected with a source region according to present invention. As shown in FIG. 3, an active region 1a as a drain region is formed linearly in contrast with the conventional one extended below, so that a bit line contact 2 and a charge storage electrode contact 4 are formed on a line which is the same direction with a bit line 3.

Accordingly, the bit line contact formed in the drain region is extended to an upper portion of the drain region and to an upper portion of a device separation insulating film formed below, so that the connection of the bit line is performed at the extended portion of the bit line contact. For this, a conductive material for bit line which is to be formed into a bit line is deposited entirely, filling a bit line contact hole and then, a bit line mask process is applied to the conductive material so as to let the bit line be parallel to the device separation insulating film. On etching the conductive material for bit line so as to form such bit line, the etch thickness is controlled in such a way that the conductive material formed relatively thick in the bit line contact region hole is left to have some thickness, allowing the bit line formed to sufficiently connect with the drain region.

Figure 4:
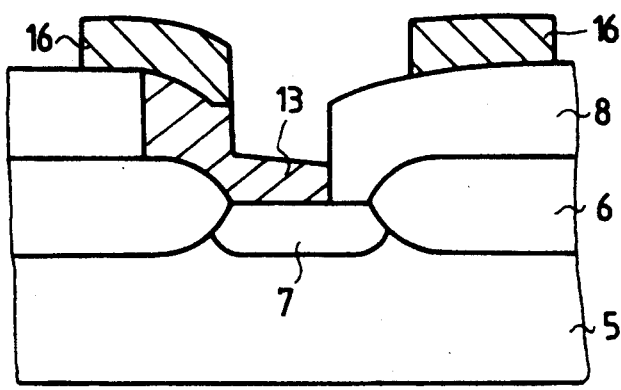
FIG. 4 is a schematic, cross sectional view showing a semiconductor connecting device in accordance with a preferred embodiment of the present invention, taken generally through section line a—a' of FIG. 3.

Referring now to FIG. 4, there is a cross-sectional view showing the structure of the connecting device according to an embodiment of the present invention, taken generally through section line a—a' of FIG. 3. As illuminated in this figure, a bit line 16 is connected with a drain region 7 through a conductive material plug 13 formed in a contact hole which is formed by etching an interlayer insulating film 8 atop the device separation insulating film 6 and the drain region 7 at a predetermined portion extending from a portion of one device separation insulating film 6 to a portion of the drain region 7.

Detailed description for method for making the semiconductor connecting device of FIG. 4 by reference to FIGS. 7A through 7D, which are schematic, cross-sectional views illustrating the steps of the method, respectively, taken generally through section line a—a' of FIG. 3.

Figure 7A:
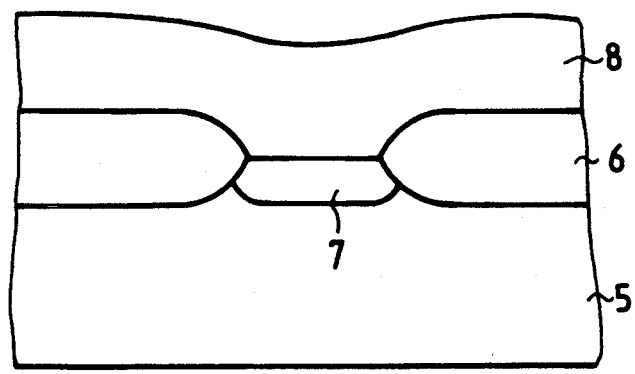
FIGS. 7A through 7D are schematic, cross sectional views illustrating the processing steps for making the semiconductor connecting device of FIG. 4.

First, as shown in FIG. 7A, a semiconductor substrate 5 is sectioned by the formation of two device separation insulating films 5 on predetermined portions into an active region and device separation regions, followed by the formation of a gate region (not shown), a source region (not shown) and a drain region 7 over the active region. And then, an interlayer insulating film 8 is entirely coated on the resulting structure. At this time, the active region where the drain region 7 is formed is to be positioned on almost the same line with other active region where the source region is formed, as shown in FIG. 3.

Figure 7B:
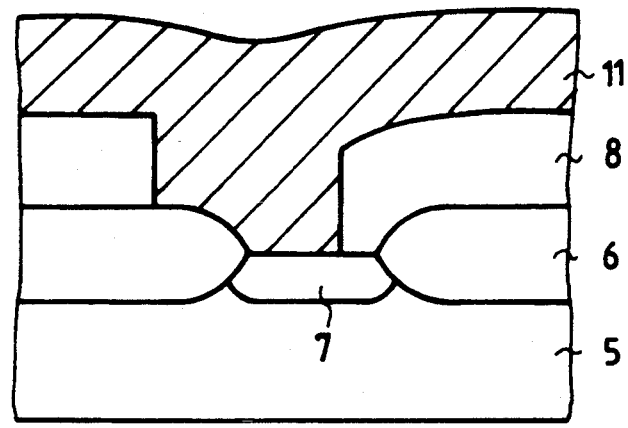
Figure 7C:
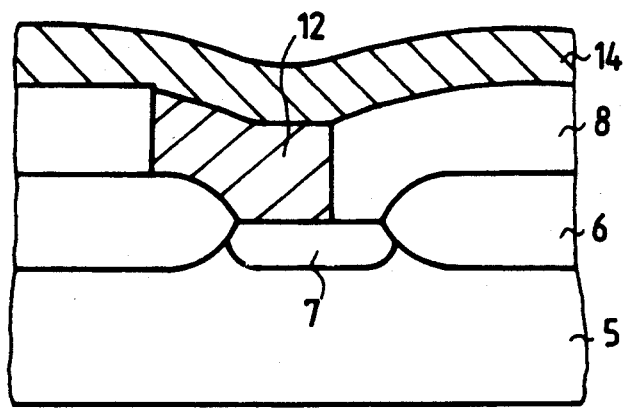

Subsequently, an etch process is applied to a predetermined portion of the interlayer film 8 comprising a part of one device separation insulating film 6 and a part of the drain region 7 to form a bit line contact hole. As a result, the bit lined contact hole is formed on the part of the drain region, extending over a portion of one device separation insulating film 6 and then, a conductive material 11 for forming a plug is entirely deposited over the resulting structure in some thickness, as shown in FIG. 7B. The bit line contact hole, which is to be in detail described later, is provided to interconnect the conductive material plug with the drain region at the drain region and to interconnect the conductive material plug with the a bit line at the device separation insulating film, Next, the conductive material for forming a plug 11 is subjected to the treatment of etch back to remove the conductive material 11 in such a thickness as to expose the interlayer insulating film 8, forming a conductive material plug 12 in the contact hole and then, a conductive material for bit line 14 is deposited entirely over the resulting structure. As a result, the conductive material for bit line 14 is formed atop the conductive material plug 12 in the contact hole whereas it covers the naked interlayer insulating film 8 in all regions except the contact region. Accordingly, the conductive materials stacked in the contact hole region is much thicker than the conductive material formed in other region.

Figure 7D:
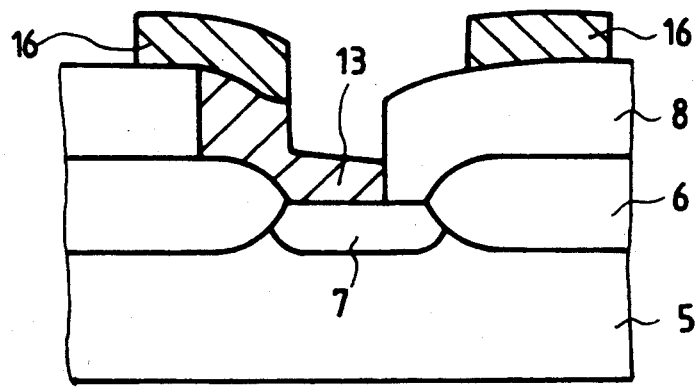

Finally, a bit line mask is patterned over the conductive material for bit line 14 in such a way to cover the portion of the interlayer insulating film 14 above the contact hole-forming device separation film 6 and not to cover the portion of the interlayer insulating film 14 above the drain region 7. Using the bit line mask patterned, an etch process is applied to completely remove the exposed portions of the conductive material for bit line 14 and to leave the conductive material plug 12 formed on the drain region of the bit line contact hole to have some thickness such as to interconnect the conductive material plug with the drain region 7, as shown in FIG. 7D. Herein, if the conductive material for forming the plug 11 has a larger etching selection ratio than the conductive material for bit line 14, this etch process is easily carried out.

Figure 5:
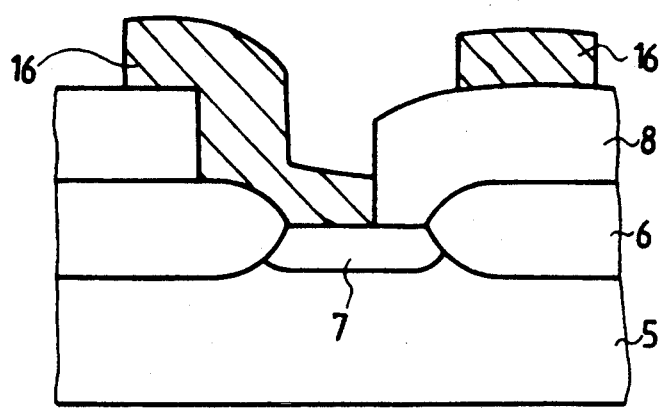
FIG. 5 is a schematic, cross sectional view showing a semiconductor connecting device in accordance with another preferred embodiment of the present invention, taken generally through section line a—a' of FIG. 3.

Referring to FIG. 5, there is a cross-sectional view showing the structure of the connecting device according to another embodiment of the present invention, taken generally through section line a—a' of FIG. 3. As elucidated in this drawing, a bit line 16 is connected with a drain region 7 formed in a contact hole which is formed by etching an interlayer insulating film 8 atop the device separation insulating film 6 and the drain region 7 at a predetermined portion extending from a portion of one device separation insulating film 6 to a portion of the drain region 7.

Figure 8A:
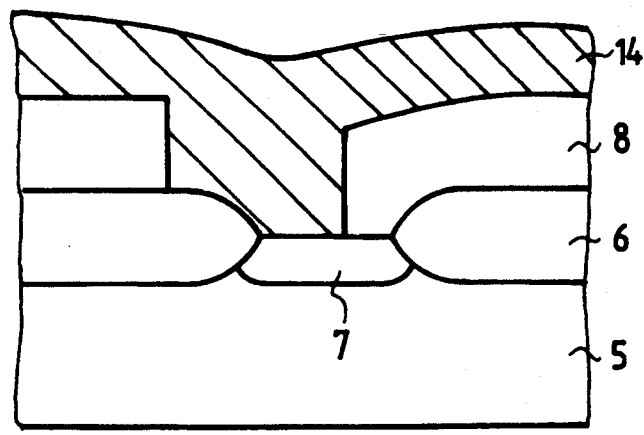
FIGS. 8A and 8B are schematic, cross sectional views illustrating the processing steps for making the semiconductor connecting device of FIG. 5.
Figure 8B:
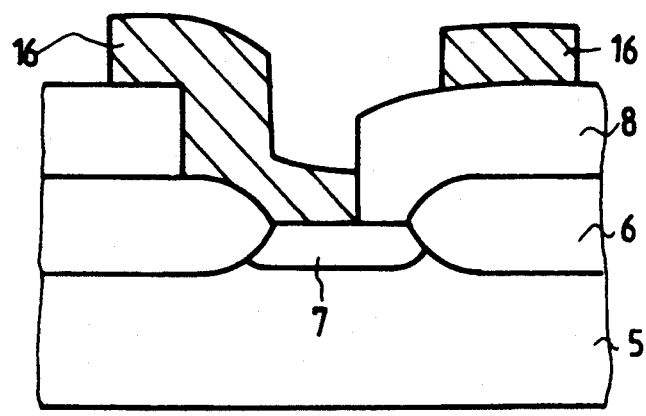

Detailed description for method for making the semiconductor connecting device of FIG. 5 by reference to FIGS. 8A and 8B, which are schematic, cross-sectional views illustrating the steps of the method, respectively, taken generally through section line a—a' of FIG. 3 and wherein the conductive material plug used in the above embodiment of FIG. 4 is not employed.

First, as shown in FIG. 8A, a semiconductor substrate 5 is sectioned by the formation of two device separation insulating films 6 on predetermined portions into an active region and device separation regions, followed by the formation of a gate region (not shown), a source region (not shown) and a drain region 7 over the active region. Thereafter, an interlayer insulating film 8 is entirely coated on the resulting structure, and then, a bit line contact hole is formed in a manner similar to that for the embodiment of FIG. 4, extending from a portion of the drain region 7 to a portion of one device separation insulating film 6. A conductive material 14 for bit line is entirely deposited at half thickness of the width of the contact hole or more, so that the bit line contact hole is completely filled therewith.

Since the bit line contact hole is full of the conductive material for bit line 14, the conductive material 14 deposited on the bit line contact hole is the thickness of the contact hole thicker than the conductive material 14 deposited on other portions.

Subsequently, a bit line mask is patterned over the conductive material for bit line 14 in such a way to cover the portion of the interlayer insulating film 14 above the ?contact hole-forming device separation film 6 and not to cover the portion of the interlayer insulating film 14 above the drain region 7. Using the bit line mask patterned, an etch process is carried out with a controlled etching degree. As a result, while the conductive material for bit line 14 deposited on the unmasked portions except the contact hole is removed completely, the conductive material for bit line 14 deposited on the unmasked contact hole is left to have some thickness, forming bit lines 16, as shown in FIG. 8B.

Figure 6:
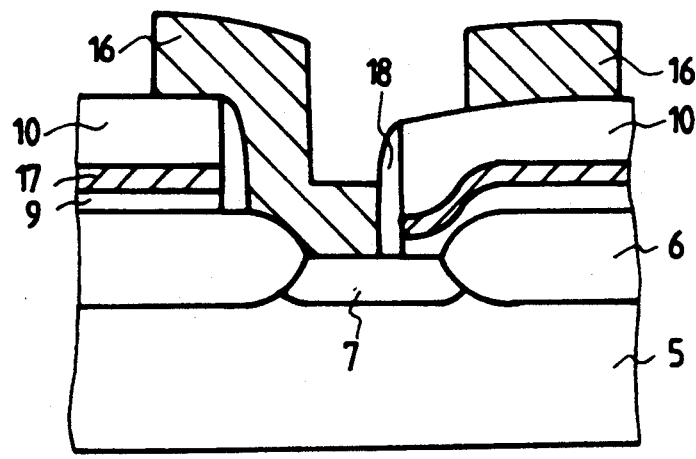
FIG. 6 is a schematic, cross sectional view showing a semiconductor connecting device in accordance with a further preferred embodiment of the present invention, taken generally through section line a—a' of FIG. 3.

Turning now to FIG. 6, there is a cross-sectional view showing the structure of the connecting device according to further another embodiment of the present invention, taken generally through section line a—a' of FIG. 3. As shown in this figure, a bit line 16 is connected with a drain region 7 formed in a contact hole which is formed by etching a second interlayer insulating film 10 and a first interlayer insulating film 9 intercalated by an etching barrier material 17 therebetween atop the device separation insulating film 6 and the drain region 7 at a predetermined portion extending from a portion of one device separation insulating film 6 to a portion of the drain region 7.

Figure 9A:
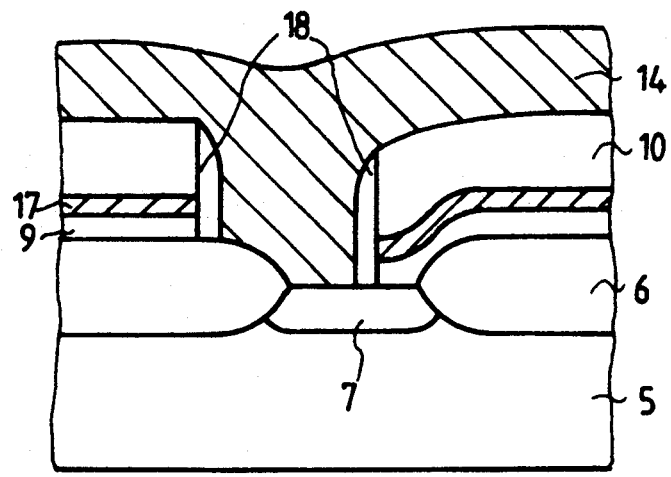
FIGS. 9A and 9B are schematic, cross sectional views illustrating the processing steps for making the semiconductor connecting device of FIG, 6.
Figure 9B:
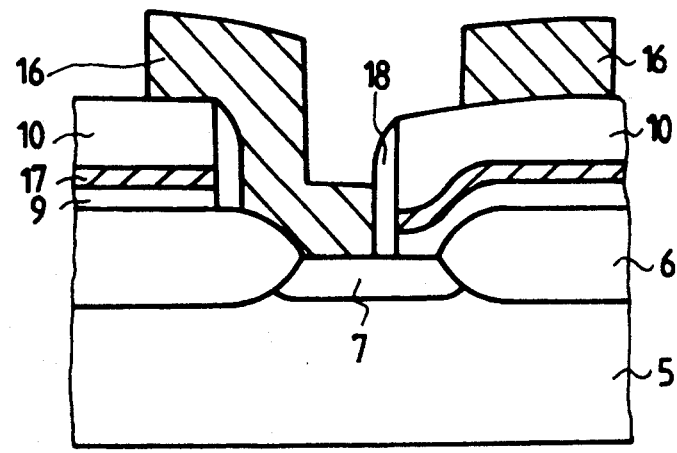

Detailed description for method for making the semiconductor connecting device of FIG. 6 with reference to FIGS. 9A and 9B, which are schematic, cross-sectional views illustrating the steps of the method, respectively, taken generally through section line a—a' of FIG. 3 and wherein the bit lines are formed in a manner similar to those for the above two preferred embodiments of the present invention, except that an etching barrier material is intercalated between the interlayer insulating films formed after the formation of the drain region in order to etch the device separation insulating film in minimum when forming the bit line contact hole, the etching barrier material having an etching selection ratio greater than the interlayer insulating films.

First, as shown in FIG. 9A, a semiconductor substrate 5 is sectioned by the formation of two device separation insulating films 6 on predetermined portions into an active region and device separation regions, followed by the formation of a gate region (not shown), a source region (not shown) and a drain region 7 over the active region. Thereafter, a first interlayer insulating film 9, an etching barrier material with a high etching selection ratio 17 and a second interlayer insulating film is formed on the resulting structure, in due order, and then, a bit line contact hole is formed at a predetermined portion comprising a part of one device separation insulating film 6 and a part of the drain region 7 by an etch process. On applying the etch process, the second interlayer insulating film 10 is easily removed whereas the etching barrier material retards the etching, so as to minimize the thickness etched thereby in the device separation insulating film 6. As a result, the bit lined contact hole is formed on the part of the drain region, extending over the part of the one device separation insulating film 6. Thereafter, a pair of spacers 18 are formed at the both side walls of the bit line contact hole and then, a conductive material for bit line 14 is entirely deposited at half thickness of the width of the contact hole or more, so that the bit line contact hole is completely filled therewith.

In the meanwhile, the etching barrier material 17 may be either an insulating film or a conductive material such as silicon film. In case that the etching barrier material 17 is a conductive material such as silicon and is formed over the entire region of cell, insulating films such as spacer insulating films 18 are formed at the side walls of the bit line contact. On the other hand, if the etching barrier material 17 is an insulating film, it is substituted for the first interlayer insulating film 9 and the second interlayer insulating film is formed thereon. In this case, the first interlayer may not be formed additionally as well as the spacer insulating film 18 may not.

Subsequently, a bit line mask is patterned over the conductive material for bit line 14 in such a way to cover the portion of the conductive material 14 above the contact hole-forming device separation film 6 and not to cover the portion of the conductive material above the drain region 7. Using the bit line mask patterned, an etch process is applied to the conductive material for bit line 14 to form bit lines 16 in a manner similar to those for the above two preferred embodiments of the present invention. carried out with a controlled etching degree.

The bit line is connected with the drain region via the conductive material left at some thickness on the drain region of the bit line contact hole. As a result, the bit line 16 connected with the drain region 7 does not overlap the source region where the charge storage electrode is formed, minimizing the cell area.

As described hereinbefore, the bit line adjoins to the conductive material plug at the portion of the contact hole-forming device separation insulating film and the conductive material plug keeps in touch with the drain region, connecting the bit line with the drain region, in accordance with the present invention. Consequently, the bit line connected with the drain region scarcely overlaps the source region where the charge storage electrode is formed, bring about the reduction of area as minimally as possible along with a highly integrated semiconductor device, in accordance with the present invention.

Whilst the present invention has been described with reference to certain preferred embodiments, it will be appreciated by those skilled in the art that numerous variations and modifications are possible without departing from the spirit or scope of the invention as broadly described.

What is claimed is:

1. A method for making a highly integrated semiconductor, comprising the steps of:

coating an interlayer insulating film entirely over a semiconductor substrate sectioned into an active region and a device separation region by the formation of a device separation insulating film, a gate electrode, a source region and a drain region being formed in said active region;

forming a contact hole to expose a portion of said drain region and a portion of said device separation insulating film;

depositing a conductive material for forming a plug entirely over the resulting structure;

applying an etch back process to said conductive material for forming a plug to form a first conductive material plug;

depositing a conductive material for bit line, entirely over the resulting structure;

etching completely said conductive material for bit line positioned on said first conductive material plug formed on said drain region within said contact hole to form a bit line; and etching not completely but partially said first conductive material plug formed on said drain region within said contact hole to form a second conductive material plug.

2. A method according to claim 1, wherein said conductive material for forming a plug has an etching selection ratio greater than said conductive material for bit line.

3. A method according to claim 1, wherein said conductive material for bit line is entirely deposited at half thickness of the width of the contact hole or more, filling said bit line contact hole.

4. A method for making a semiconductor connecting device, comprising the steps of:

coating an interlayer insulating film entirely over a semiconductor substrate sectioned into an active region and a device separation region by the formation of a device separation insulating film, a gate electrode, a source region and a drain region being formed in said active region;

forming a contact hole to expose a portion of said drain region and a portion of said device separation insulating film;

depositing a conductive material for forming a plug entirely over the resulting structure; and etching not completely but partially said conductive material for bit line formed on said drain region within said contact hole to form a bit line.

5. A method according to claim 4, wherein said conductive material for bit line is entirely deposited at half thickness of the width of the contact hole or more, filling said bit line contact hole.

6. A method for making a semiconductor connecting device comprising the steps of:

forming a gate electrode, a source region and a drain region at an active region which is sectioned by the formation of device separation insulating film in a semiconductor substrate;

coating an interlayer insulating film intercalated with an etching barrier material therebetween on the resulting structure, the interlayer insulating film being sectioned into a first interlayer film and a second interlayer film;

applying an etch process to said interlayer insulating film to form a contact hole exposing a portion of said drain region and a portion of said device separation insulating film therethrough;

forming a pair of spacers at the both side walls of said contact hole;

depositing a conductive material entirely over the resulting structure; and etching not completely but partially said conductive material for bit line formed on said drain region within said contact hole to form a bit line.

7. A method according to claim 6, wherein said conductive material for forming a plug has an etching selection ratio greater than said conductive material for bit line.

8. A method according to claim 6, wherein said conductive material for bit line is entirely deposited at half thickness of the width of the contact hole or more, filling said bit line contact hole.

* * * * *